(12) United States Patent
Huang et al.

(10) Patent No.: US 8,054,540 B2
(45) Date of Patent: Nov. 8, 2011

(54) OPTICAL WAVEGUIDE AMPLIFIER USING HIGH QUANTUM EFFICIENCY SILICON NANOCRYSTAL EMBEDDED SILICON OXIDE

(75) Inventors: Jiandong Huang, Vancouver, WA (US); Pooran Chandra Joshi, Vancouver, WA (US); Hao Zhang, Vancouver, WA (US); Apostolos T. Voutsas, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 433 days.

(21) Appl. No.: 12/259,986

(22) Filed: Oct. 28, 2008

(65) Prior Publication Data
US 2009/0040599 A1    Feb. 12, 2009

Related U.S. Application Data

(63) Continuation-in-part of application No. 12/197,045, filed on Aug. 22, 2008, which is a continuation-in-part of application No. 12/126,430, filed on May 23, 2008, now Pat. No. 7,998,884, which is a continuation-in-part of application No. 11/418,273, filed on May 4, 2006, now Pat. No. 7,544,625, and a continuation-in-part of application No. 11/327,612, filed on Jan. 6, 2006, now Pat. No. 7,723,242, and a continuation-in-part of application No. 11/013,605, filed on Dec. 15, 2004, now Pat. No. 7,446,023, and a continuation-in-part of application No. 10/801,377, filed on Mar. 15, 2004, now Pat. No. 7,122,487, and a continuation-in-part of application No. 11/139,726, filed on May 26, 2005, now Pat. No. 7,381,595, and a continuation-in-part of application No. 10/871,939, filed on Jun. 17, 2004, now Pat. No. 7,186,663, and a continuation-in-part of application No. 10/801,374, filed on Mar. 15, 2004, now Pat. No. 7,087,537.

(51) Int. Cl.
    *H01S 5/00* (2006.01)
(52) U.S. Cl. ...................................................... 359/344
(58) Field of Classification Search .................. 359/344
    See application file for complete search history.

(56) References Cited

U.S. PATENT DOCUMENTS
6,710,366 B1 * 3/2004 Lee et al. ......................... 257/14
(Continued)

OTHER PUBLICATIONS

Lian, et al. "A buried silicon nanocrystals based high gain coefficient SiO2/ SiOx/ SiO2/ Strip-Loaded Waveguide Amplifier on Quartz Substrate", Material Research Society Symposium Proceedings vol. 1076, K05-02 (presented Mar. 24-28, 2008).*

(Continued)

*Primary Examiner* — Eric Bolda
(74) *Attorney, Agent, or Firm* — Law Office of Gerald Maliszewski; Gerald Maliszewski

(57) ABSTRACT

A method is provided for optical amplification using a silicon (Si) nanocrystal embedded silicon oxide (SiOx) waveguide. The method provides a Si nanocrystal embedded SiOx waveguide, where x is less than 2, having a quantum efficiency of greater than 10%. An optical input signal is supplied to the Si nanocrystal embedded SiOx waveguide, having a first power at a first wavelength in the range of 700 to 950 nm. The Si nanocrystal embedded SiOx waveguide is pumped with an optical source having a second power at a second wavelength in a range of 250 to 550 nm. As a result, an optical output signal having a third power is generated, greater than the first power, at the first wavelength. In one aspect, the third power increases in response to the length of the waveguide strip.

18 Claims, 7 Drawing Sheets

U.S. PATENT DOCUMENTS

| | | | | |
|---|---|---|---|---|
| 7,068,420 | B2 * | 6/2006 | Tallone et al. | 359/333 |
| 7,095,058 | B2 * | 8/2006 | Gardner | 257/98 |
| 7,336,684 | B2 * | 2/2008 | Sparacin et al. | 372/6 |
| 2004/0053009 | A1 * | 3/2004 | Ozin et al. | 428/168 |
| 2005/0255619 | A1 * | 11/2005 | Negro et al. | 438/28 |
| 2006/0012853 | A1 * | 1/2006 | Tallone et al. | 359/333 |
| 2006/0039433 | A1 * | 2/2006 | Simpson | 372/50.1 |
| 2006/0211267 | A1 * | 9/2006 | Joshi et al. | 438/778 |
| 2007/0161134 | A1 * | 7/2007 | Lin et al. | 438/22 |

OTHER PUBLICATIONS

Pavesi et al., "Optical gain in silicon nanocrystals", Nature, vol. 408, Nov. 23, 2000, pp. 440-444.*

Liu et al., Polarity-controlled visible/infrared electroluminescence in Si-nanocrystal/Si light-emitting devices, Applied Physics Letters, vol. 97, 071112.

* cited by examiner

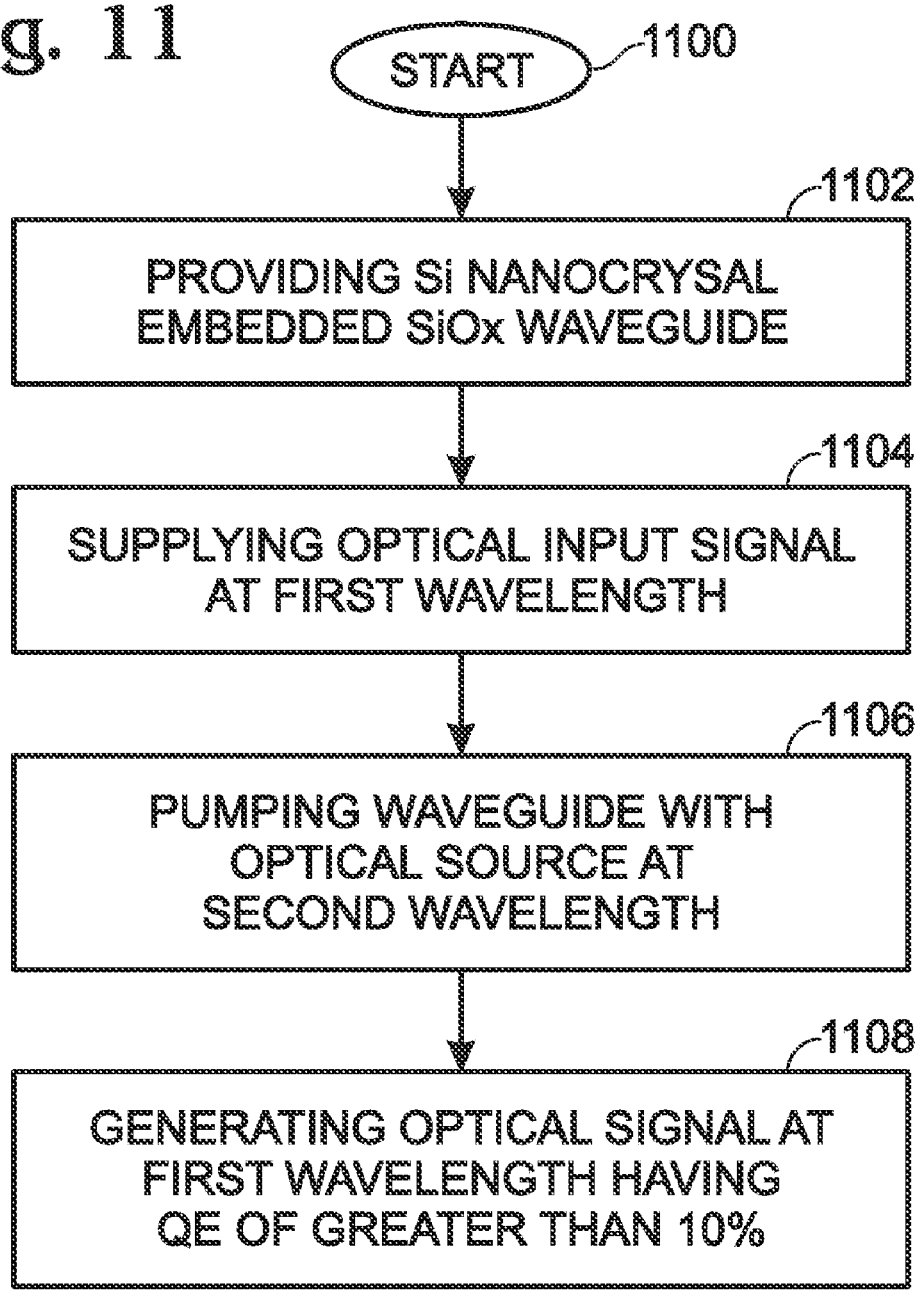

OPTICAL WAVEGUIDE AMPLIFIER USING HIGH QUANTUM EFFICIENCY SILICON NANOCRYSTAL EMBEDDED SILICON OXIDE

RELATED APPLICATIONS

This application is a continuation-in-part of a pending patent application entitled, SILICON NANOCRYSTAL EMBEDDED SILICON OXIDE ELECTROLUMINESCENCE DEVICE WITH A MID-BANDGAP TRANSITION LAYER, invented by Huang et al. Ser. No. 12/197,045 filed on Aug. 22, 2008, which is a Continuation-in-Part of:

patent application, LIGHT EMITTING DEVICE WITH A NANOCRYSTALLINE SILICON EMBEDDED INSULATOR FILM, invented by Huang et al. Ser. No. 12/126,430, filed on May 23, 2008 now U.S. Pat. No. 7,998,884, which is a Continuation-in-Part of the following applications:

SILICON OXIDE THIN-FILMS WITH EMBEDDED NANOCRYSTALLINE SILICON, invented by Pooran Joshi et al, Ser. No. 11/418,273, filed May 4, 2006 now U.S. Pat. No. 7,544,625;

ENHANCED THIN-FILM OXIDATION PROCESS, invented by Pooran Joshi et al., Ser. No. 11/327,612, filed Jan. 6, 2006 now U.S. Pat. No. 7,723,242;

HIGH-DENSITY PLASMA HYDROGENATION, invented by Pooran Joshi et al. Ser. No. 11/013,605, filed Dec. 15, 2004 now U.S. Pat. No. 7,446,023;

DEPOSITION OXIDE WITH IMPROVED OXYGEN BONDING, invented by Pooran Joshi, Ser. No. 10/801,377, filed Mar. 15, 2004 now U.S. Pat. No. 7,122,487;

HIGH-DENSITY PLASMA OXIDATION FOR ENHANCED GATE OXIDE PERFORMANCE, invented by Joshi et al., Ser. No. 11/139,726, filed May 26, 2005 now U.S. Pat. No. 7,381,595;

HIGH-DENSITY PLASMA PROCESS FOR SILICON THIN-FILMS, invented by Pooran Joshi, Ser. No. 10/871,939, filed Jun. 17, 2004 now U.S. Pat. No. 7,186,663;

METHOD FOR FABRICATING OXIDE THIN-FILMS, invented by Joshi et al., Ser. No, 10/801,374, filed Mar. 15, 2004 now U.S. Pat. No. 7,087,537.

All the above-referenced applications are incorporated herein by reference.

BACKGROUND OF THE INVENTION

1. Field of the Invention

This invention generally relates to optical devices and, more particularly, to a high quantum efficiency optical device using a silicon, nanocrystal embedded silicon oxide film.

2. Description of the Related Art

The unique structural, electrical, and optical properties of nanocrystalline silicon have attracted interest for their use in optoelectronic and integrated memory devices. Silicon is the material of choice for the fabrication of optoelectronic devices because of well-developed processing technology. However, the indirect band-gap makes it an inefficient material for light emitting optoelectronic devices. Over the years, various R&D efforts have focused on tailoring the optical function of Si to realize Si-based light emitting optoelectronics. The achievement of efficient room temperature light emission from the nano-crystalline silicon is a major step towards the achievement of fully Si-based optoelectronics.

The fabrication of stable and reliable optoelectronic devices requires Si nanocrystals with high photoluminescence (PL) and electroluminescence (EL) quantum efficiency. One approach that is being actively pursued for integrated optoelectronic devices is the fabrication of $SiO_x$ ($x \leq 2$) thin films with embedded Si nanocrystals. The luminescence due to recombination of the electron-hole pairs confined in Si nanocrystals depends strongly on the nanocrystal size. The electrical and optical properties of the nanocrystalline Si embedded SiOx thin films depend on the size, concentration, and size distribution of the Si nanocrystals. Various thin-film deposition techniques such as sputtering and plasma-enhanced chemical vapor deposition (PECVD), employing capacitively-coupled plasma source, are being investigated for the fabrication, of stable and reliable nanocrystalline Si thin films.

However, conventional PECVD and sputtering techniques have the limitations of low plasma density, inefficient power coupling to the plasma, low ion/neutral ratio, and uncontrolled bulk, and interface damage due to high ion bombardment energy. Therefore, the oxide films formed from a conventional capacitively-coupled plasma (CCP) generated plasma may create reliability issues due to the high bombardment energy of the impinging ionic species. It is important to control or minimize any plasma-induced bulk or interface damage. However, it is not possible to control the ion energy using radio frequency (RF) of CCP generated plasma. Any attempt to enhance the reaction kinetics by increasing the applied power results in increased bombardment of the deposited film, which creates a poor quality films with a high defect concentration. Additionally, the low plasma density associated, with these types of sources ($\sim 1 \times 10^8$-$10^9$ cm$^{-3}$) leads to limited reaction possibilities in the plasma and on the film surface, inefficient generation of active radicals for enhanced process kinetics, inefficient oxidation, and reduction of imparities at low thermal budgets, which limits their usefulness in the fabrication of low-temperature electronic devices.

A deposition process that offers a more extended, processing range and enhanced plasma characteristics than conventional plasma-based techniques, such as sputtering, PECVD, etc., is required to generate and control the particle size for PL/EL based device development. A process that can enhance plasma density and minimize plasma bombardment will, ensure the growth of high, quality films without plasma-induced microstructural damage, A process that can offer the possibility of controlling the interface and bulk quality of the films independently will enable the fabrication of high performance and high reliability electronic devices. A plasma process that can efficiently generate the active plasma species, radicals and ions, will enable noble thin film development with controlled process and property control.

For the fabrication of high quality SiOx thin films, the oxidation of the growing film is also critical to ensure high quality insulating layer across the nanocrystalline Si particles. A process that can generate active oxygen radicals at high concentrations will ensure effective passivation of the Si nanoparticles in the oxide matrix surrounding it. A plasma process that can minimize plasma-induced damage will enable the formation of a high quality interface that is critical for the fabrication of high quality devices. Low thermal budget efficient oxidation and hydrogenation processes are critical and will be significant for the processing of high quality optoelectronic devices. The higher temperature thermal processes can interfere with the other device layers and it is not suitable in terms of efficiency and thermal budget, due to the lower reactivity of the thermally activated species. Additionally, a plasma process which can provide a more complete solution and capability in terms of growth/deposition of novel film structures, oxidation, hydrogenation, particle size creation and control, and independent control of plasma density and ion energy, and large area processing is desired for the development of high performance optoelectronic devices. Also, it is important to correlate the plasma process with the thin film properties as the various plasma, parameters dictate the thin film properties and the desired film quality depends on the target application. Some of the key plasma and thin-film characteristics that depend on the target application are deposition rate, temperature, thermal budget, density, microstructure, interface quality, impurities, plasma-induced damage, state of the plasma generated active species (radicals/ ions), plasma potential, process and system scaling, and electrical quality and reliability. A correlation among these parameters is critical to evaluate the film quality as the process map will dictate the film quality for the target application. It may not be possible to learn or develop thin-films by just extending the processes developed in low density plasma or other high density plasma systems, as the plasma energy, composition (radical to ions), plasma potential, electron temperature, and thermal conditions correlate differently depending on the process map.

Low temperatures are generally desirable in liquid crystal display (LCD) manufacture, where large-scale devices are formed on transparent glass, quartz, or plastic substrate. These transparent substrates can be damaged when exposed to temperatures exceeding 650 degrees C. To address this temperature issue, low-temperature Si oxidation processes have been developed. These processes use a high-density plasma source such as an inductively coupled, plasma (ICP) source, and are able to form Si oxide with a quality comparable to 1200 degree C. thermal oxidation methods.

Photoluminescence (PL) quantum efficient QE is defined herein as the ratio of the photons emitted at longer wavelengths to the number of photons absorbed at shorter wavelengths, and it is a measure of the photo-conversion efficiency of a film or device. Since the absorption of energy by a material is a function of excitation wavelength, and the energy of a photon is inversely proportional to its wavelength, QE is often measured over a range of different wavelengths to characterize a device's efficiency.

It would be advantageous if a high quantum efficiency waveguide device could be fabricated with Si nanocrystal embedded. SiOx films.

SUMMARY OF THE INVENTION

Described herein is an optical waveguide amplifier using a newly developed high quantum efficiency silicon (Si) nanocrystal embedded Si oxide (SiOx) film as a gain material for wavelengths near 750 nanometers (nm). The intensity decay of optical signals, due to absorption and scattering, can result in poor system performance. The instant waveguide enables longer-reach optical signal propagation and increases the power budget in optical system designs. In one aspect, guide modes for Si nanocrystal embedded SiOx thin films with a thickness of about 600 nm are sandwiched between a substrate and air. At this thickness, and as based upon calculation from optical waveguiding theory, one TE and one TM modes are supported in the waveguide.

Si nanocrystal embedded SiOx films demonstrate a very high quantum efficiency when being optically pumped. The gain of this new type of amplifier can be measured using the widely accepted method of "variable strip lengths". In measurements, a clear spectra narrowing of light emissions from the waveguide is observed. When optically pumped at 390 nm, gains as high as ~130 are observed, with a bandwidth of 30 nm centered at 750 nm.

This optically pumped waveguide amplifier can be used in communications between integrated optical circuits. The waveguide can also be used before photo-detectors as a preamplifier to boost signal levels above detection limits, especially for amorphous Si ($\alpha$-Si) based photodetectors, to enhance sensing beyond the cut-off wavelength above 750 nm.

Accordingly, a method is provided for optical amplification using a Si nanocrystal embedded SiOx waveguide. The method provides a Si nanocrystal embedded SiOx waveguide, where x is less than 2, having a quantum efficiency of greater than 10%. An optical input signal is supplied to the Si nanocrystal embedded SiOx waveguide, having a first power at a first wavelength in the range of 700 to 950 nm. The Si nanocrystal embedded SiOx waveguide is pumped with an optical source having a second power at a second wavelength in a range of 250 to 550 nm. As a result, an optical output signal having a third power is generated, greater than the first power, at the first wavelength. In one aspect, the third power increases in response to the length of the waveguide strip.

In another aspect, the Si nanocrystal embedded SiOx strip is fabricated using a high density plasma-enhanced chemical vapor deposition (HDPECVD) process. Subsequent to depositing a SiOx strip using the HDPECVD process, the SiOx strip is annealing, embedding Si nanocrystals in the SiOx strip. Si nanocrystals are formed having a diameter in a range of about 2 to 10 nm. The HDPECVD process uses a plasma concentration of greater than $1\times10^{11}$ cm$^{-3}$, with an electron temperature of less than 10 eV.

Additional, details of the above-described method and a Si nanocrystal embedded SiOx waveguide are provided below,

BRIEF DESCRIPTION OF THE DRAWINGS

FIG. 11 is a flowchart illustrating a method for optical amplification using a Si nanocrystal embedded SiOx waveguide.

DETAILED DESCRIPTION

Figure 1:
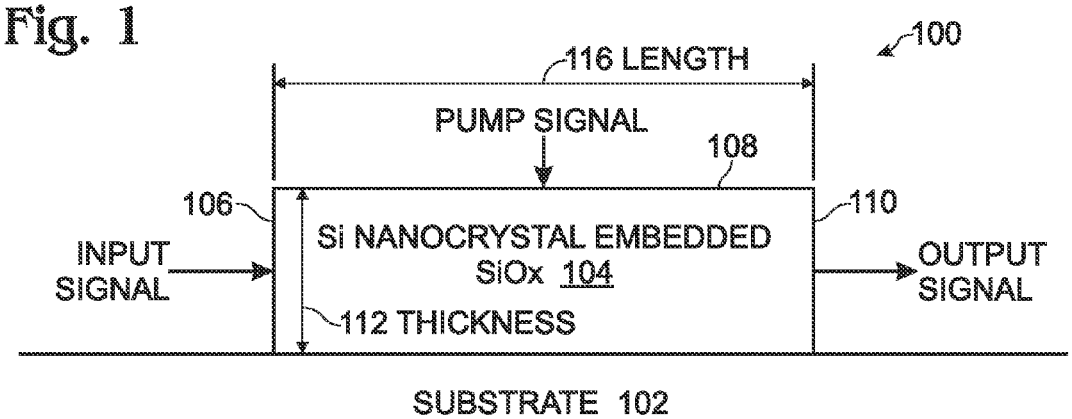
FIG. 1 is a partial cross-sectional view of a silicon (Si) nanocrystal embedded silicon oxide (SiOx) waveguide.

FIG. 1 is a partial cross-sectional view of a silicon (Si) nanocrystal embedded silicon oxide (SiOx) waveguide. The waveguide 100 comprises a bottom substrate 102 having an optical index. For example, the substrate 102 may be silicon dioxide. A Si nanocrystal embedded SiOx strip 104, where x is less than 2, overlies the bottom substrate. The Si nanocrystal embedded SiOx strip 104 has an optical index greater than the underlying (bottom substrate) optical index, and a first interface 106 accept an optical input signal with a first power at a first wavelength in a range of 700 to 950 nanometers (nm). Typically, the Si nanocrystal embedded SiOx waveguide 104 has an optical index in the range of about 1.58 to 1.75.

The Si nanocrystal embedded SiOx strip 104 has a second interface 108 to accept an optical source pump signal having a second power at a second wavelength in the range of 250 to 550 nm, and a third interface 110 to supply an optical output signal having a third, power, greater than the first power, at the first wavelength, with a quantum efficiency of greater than 10%. The Si nanocrystal embedded SiOx strip 104 has a thickness 112 in the range of about 400 microns to about 1000 nm. The Si nanocrystal embedded SiOx strip 104 has a strip width (not shown in this view) in the range of about 50 to 500 microns, and a strip length 116.

Functional Description

The above-described high gain optical waveguide amplifier is fabricated using a high quantum efficiency silicon rich silicon oxide material at wavelengths near 750 nm, with an operational bandwidth of about 50 nm. The SiOx thin film waveguides are deposited using HDPCVD (high density plasma-enhanced chemical vapor depositions) processes, which produce a high quality thin film with a quantum efficiency as high, as 48%.

Figure 2:
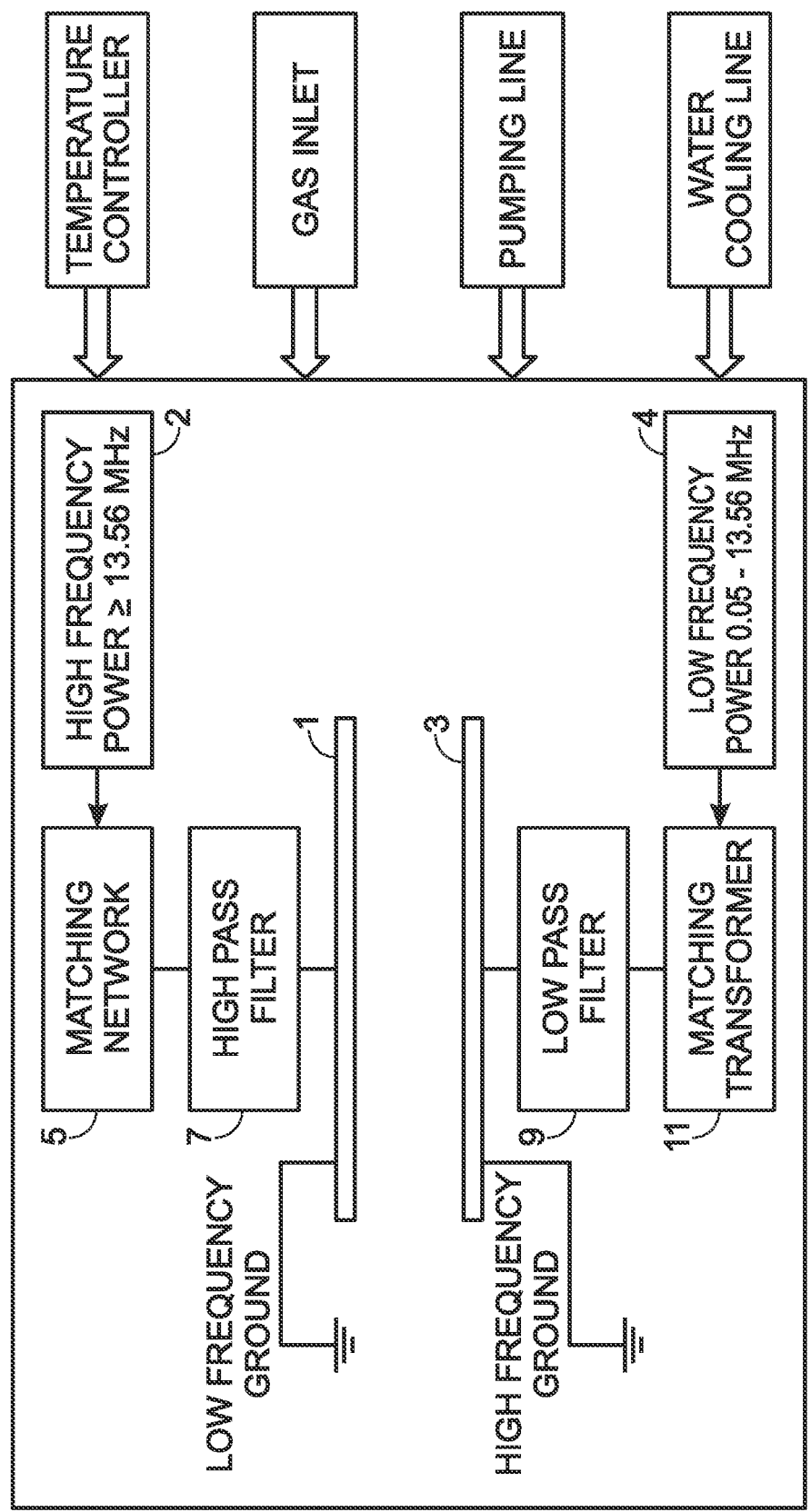
FIG. 2 is a schematic drawing of a high-density plasma (HDP) system with an inductively coupled plasma source.

FIG. 2 is a schematic drawing of a high-density plasma (HDP) system with an inductively coupled plasma source. The system depicted in FIG. 12 is one example of a system that can be used to enable the above-described HDPECVD process for the deposition of Si-nc SiOx. The top electrode 1 is driven by a high frequency radio frequency (RF) source 2, while the bottom electrode 3 is driven by a lower frequency power source 4. The RF power is coupled to the top electrode 1, from the high-density inductively coupled plasma (ICP) source 2, through a matching network 5 and high pass filter 7. The power to the bottom electrode 3, through a low pass filter 9 and matching transformer 11, can be varied independently of the top electrode 1. The top electrode power frequency can be in the range of about 13.56 to about 300 megahertz (MHz) depending on the ICP design. The bottom electrode power frequency can be varied in the range of about 50 kilohertz (KHz) to about 13.56 MHz, to control the ion energy. The pressure can be varied up to 500 mTorr. The top electrode power can be as great as about 10 watts per square-centimeter (W/cm$^2$), while the bottom electrode power can be as great as about 3 W/cm$^2$.

One interesting feature of the HDP system is that there are no inductive coils exposed to the plasma, which eliminates any source-induced impurities. The power to the top and bottom electrodes can be controlled independently. There is no need to adjust the system body potential using a variable capacitor, as the electrodes are not exposed to the plasma. That is, there is no crosstalk between the top and bottom electrode powers, and the plasma potential is low, typically less than 20 V. System body potential is a floating type of potential, dependent on the system design and the nature of the power coupling.

The HDP tool is a true high density plasma process with an electron concentration of greater than $1 \times 10^{11}$ cm$^{-3}$, and the electron temperature is less than 10 eV. There is no need to maintain a bias differential between, the capacitor connected to the top electrode and the system body, as in many high density plasma systems and conventional designs such as capacitively-coupled plasma tools. Alternately stated, both the top and bottom electrodes receive RF and low frequency (LF) powers.

Figure 3:
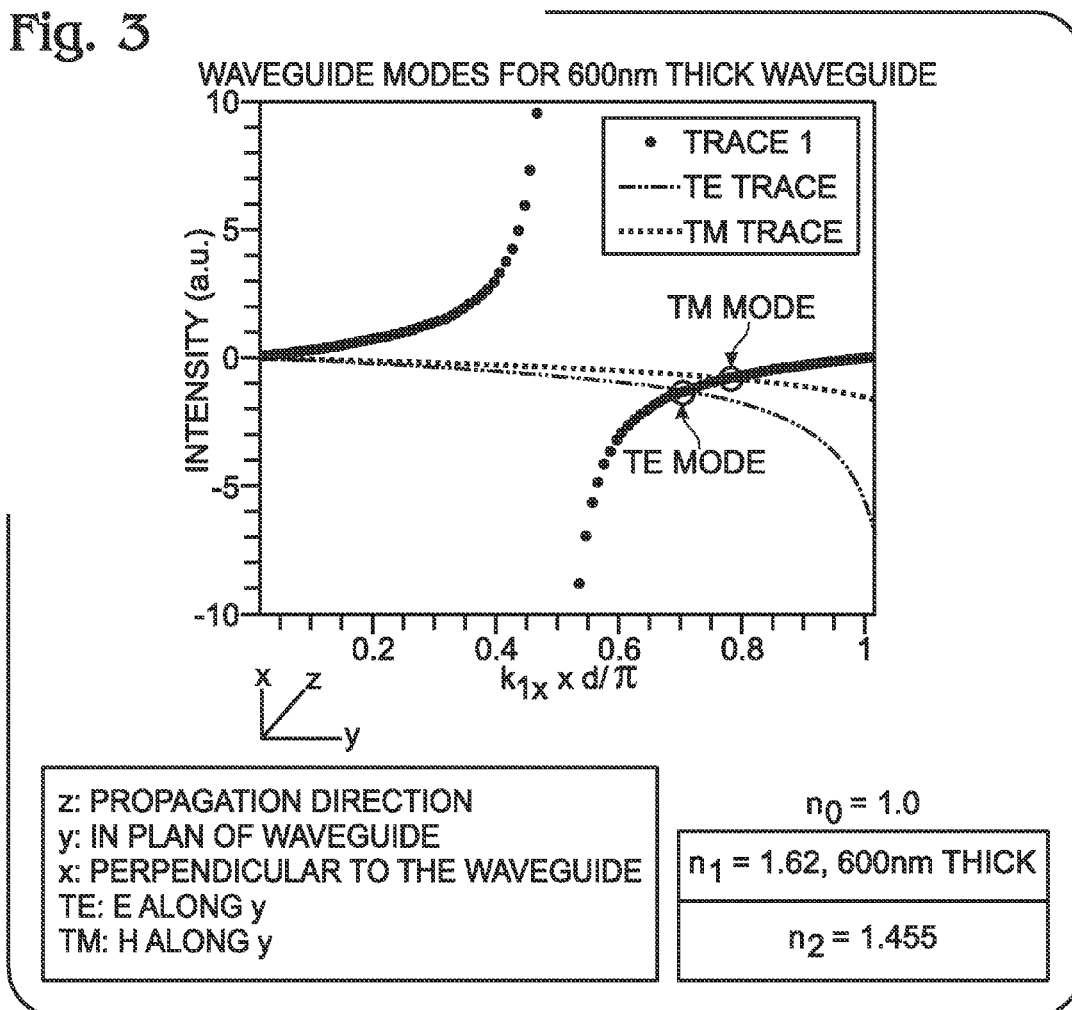
FIG. 3 is a diagram depicting a Si nanocrystal embedded SiOx thin film waveguide and the supported modes for operation at a wavelength $\lambda$=720 nm.

FIG. 3 is a diagram depicting a Si nanocrystal embedded. SiOx thin film waveguide and the supported modes for operation at a wavelength $\lambda$=720 nm. The mode is the cross of Trace 1, with, the corresponding TE Trance and TM Trance. Si nanocrystal embedded SiOx films (with optical index $n_1$=1.64) were deposited on top of quartz ($n_2$1.46) with air (n=1) as the top medium. Calculations based on optical waveguiding theory show that there exists a thickness threshold below which no guided mode is supported at wavelengths near 800 nm. For a waveguide with a thickness of 800 nm, one transverse electric (TE) or transverse magnetic (TM) mode is supported to achieve wave-guiding through index contrast, as shown. Waveguides with a thickness of 600 microns (μm) were fabricated using above-mentioned HDPCVD process with optimized process windows for high quantum efficiency. Practically, due to the fluctuation of the thickness, the Si nanocrystal embedded SiOx waveguides support a few modes for operations at wavelength near 800 nm.

Figure 4:
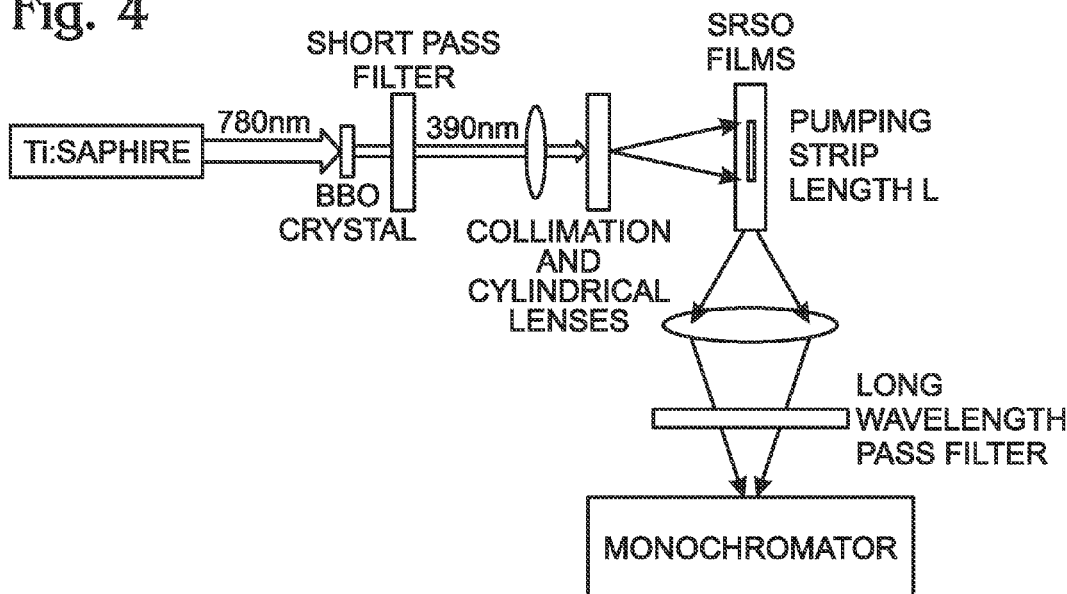
FIG. 4 depicts an experimental setup for "Variable Strip Length Method" measurements.

FIG. 4 depicts an experimental setup for "Variable Strip Length Method" measurements. The strips are created by a cylindrical lens after beam expansion collimation lenses. The measurements are done with long wavelength pass to filter out the pump light. As shown, a laser beam, (at 390 nm generated from the second harmonies of the Ti:Saphire femtosecond laser) is expanded and collimated by regular round lenses, after passing through a Beta barium borate (β-BaB$_2$O$_4$) crystal. The expanded beam is then aligned with a cylindrical lens to create the required strip with length l on the measured waveguides. In theory, if there exists a net gain, $g_{mod}$, the measured intensity $I_{ASE}$ from the amplified, spontaneous emission is described as;

$$I_{ASE} = J_{sp}/g_{mod} \times (\exp(g_{mod} \times l) - 1) \qquad \text{Equation 1}$$

It can be seen that for the waveguides, gain $g_{mod}$ can be deduced by fitting the measured intensity data as the function of strip lengths, l.

Figure 5:
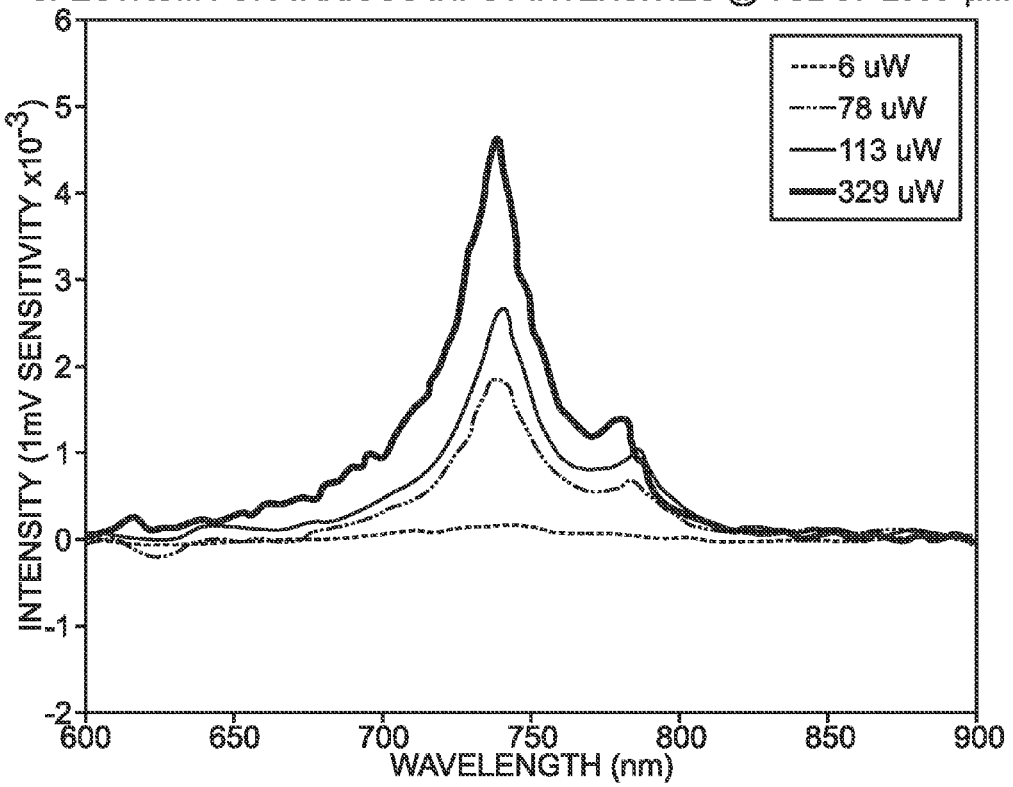
FIG. 5 is a graph depicting the spectral narrowing emissions from, a waveguide optically pumped at various powers for a fixed length (2000 μm stripe length).

FIG. 5 is a graph depicting the spectral narrowing emissions from a waveguide optically pumped at various powers for a fixed length (2000 μm stripe length). It is clearly seen that the emission spectra narrows as the pump intensities increases. The spectral narrowing phenomena are a direct result of the amplified spontaneous emissions (ASE) when samples are pumped above the ASE threshold. As shown, for a strip of a fixed length 2000 μm, as the pump intensity increases, the emission become stronger. At the same time, the emission spectra become narrowed with a full width at half magnitude (FWHM) that changes from >100 nm to ~25 nm. It is important to measure the gain using the spectral intensity peaks as the function of strip lengths to deduce the optical gain, rather than using the totally collected light. The latter measurement includes too much scattered light.

Figure 6A:
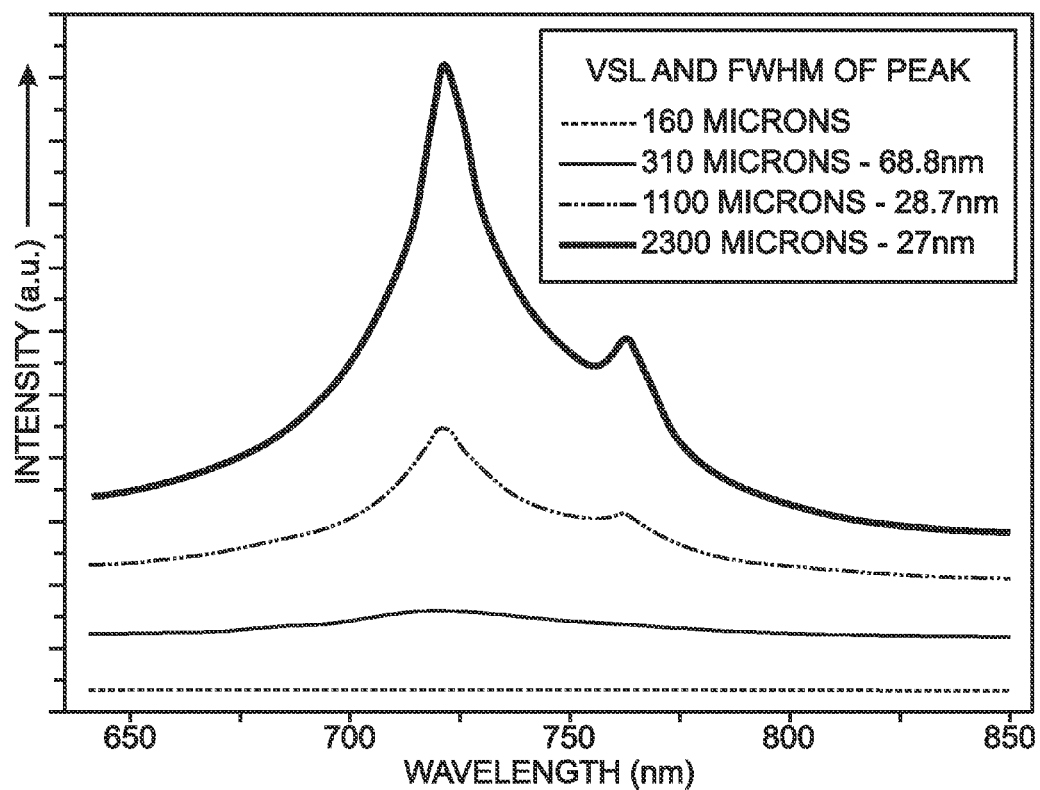
FIG. 6A through 6C are graphs depicting emission spectral intensities as the function of strip lengths at a fixed pump power.
Figure 6B:
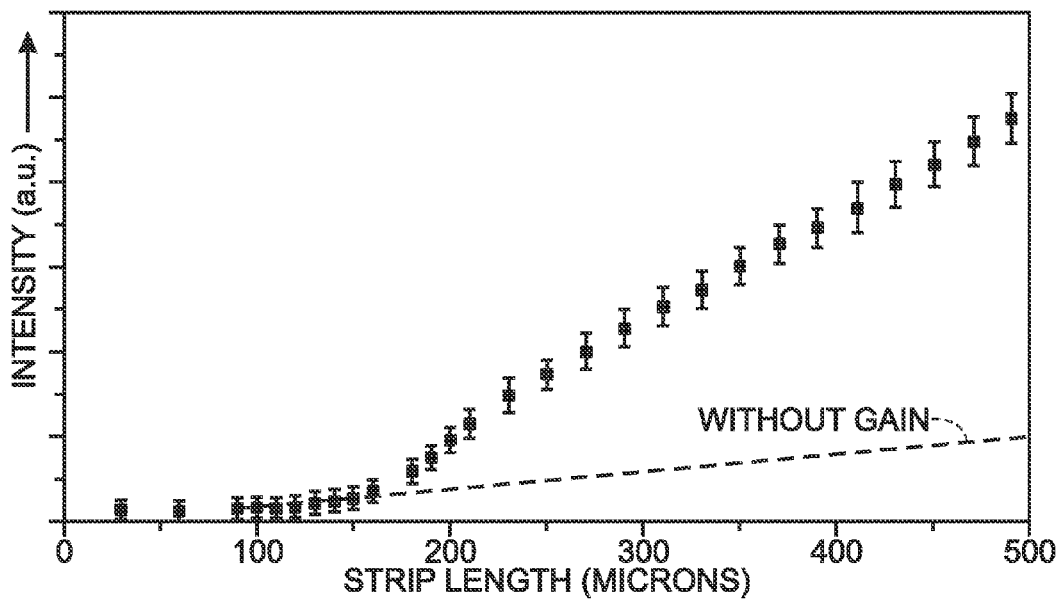
Figure 6C:
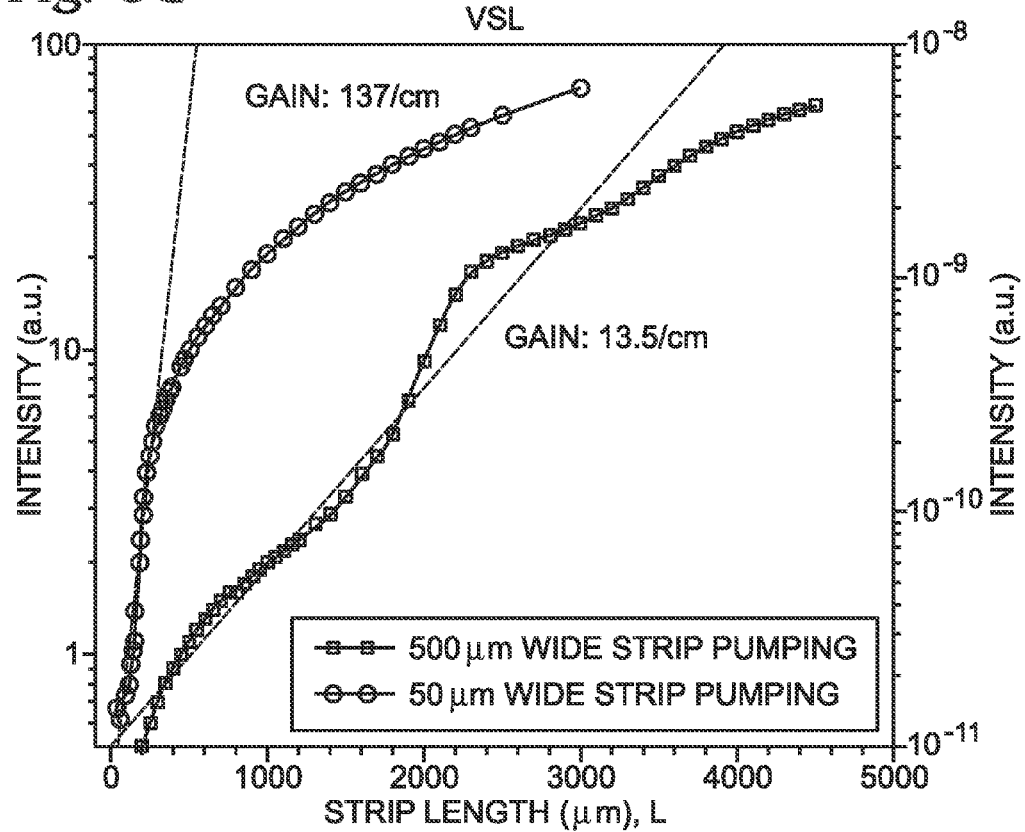

FIG. 6A through 6C are graphs depicting emission spectral intensities as the function of strip lengths at a fixed pump power. In FIG. 6A, the pumping power is 300 μW. It is clearly seen that the emission spectral peaks increase as the function, of strip length. The spectra narrows from above 100 nm (FWHM) to 27 nm (FWHM) due to the amplified spontaneous emissions. In FIG. 6B emission peak intensity is shown as the function of strip lengths. A clear threshold behavior is observed, which directly results from amplified spontaneous emissions along the excited strip. The dotted line depicts threshold behavior for the case without optical gain, in which a linear increase of intensity with the stripe length would be expected.

FIG. 6C is a graph comparing strip excitation with widths of 500 μm and 50 μm. The gains are deduced from fitting the data with Equation 1 using the corresponding spectral peaks as $I_{ASE}$. It is shown that the gain increases to 137/cm for the strip width of 50 μm, followed with a saturation for a strip length longer than about 350 μm. This is the highest optical gain known, to have been reported.

Figure 7:
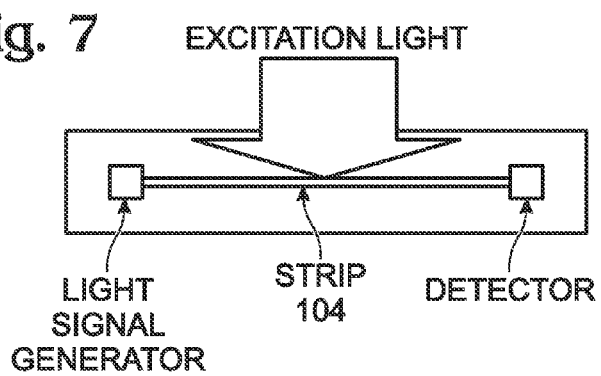
FIG. 7 is an optically excited Si nanocrystal embedded SiOx waveguide amplifier in an integrated photonic circuit application.

FIG. 7 is an optically excited Si nanocrystal embedded SiOx waveguide amplifier in an integrated photonic circuit application. Since the signal experiences gain before entering the detector, signal propagation is enhanced.

Figure 8:
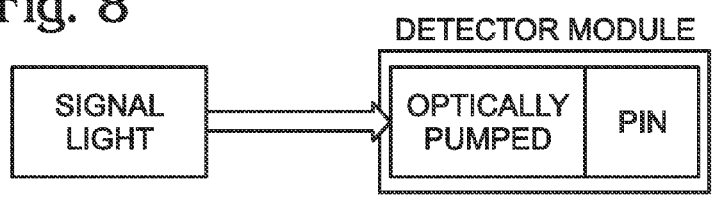
FIG. 8 depicts the Si nanocrystal embedded SiOx waveguide used as an optical preamplifier in front of photo-detector to form a detection module for high SNR (signal to noise ratio) applications.

FIG. 8 depicts the Si nanocrystal embedded SiOx waveguide used as an optical preamplifier in front of photodetector to form a detection module for high SNR (signal to noise ratio) applications.

Figure 9:
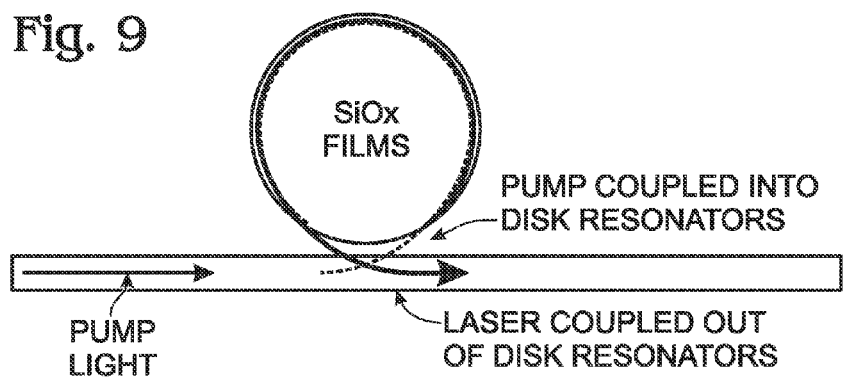
FIG. 9 is a schematic drawing depicting a Si nanocrystal embedded SiOx film micro disk waveguide.

FIG. 9 is a schematic drawing depicting a Si nanocrystal embedded SiOx film micro disk waveguide. In addition to lasing action using the SiOx film as an active media, suitable optical cavity designs may be added, such as high quality factor micro disk and photonic cavity. As shown, the Si nanocrystal embedded SiOx films are fabricated into micro disk. A waveguide can be placed very close to the disk to achieve near critical couplings. As the coupled pump light is gradually absorbed by the Si nanocrystal embedded SiOx film, the emission from, the film is gradually amplified with the optical gains discussed above. When the quality factor of the disk is high enough that the gains overcome the losses, lasing actions occur. The laser can also be coupled into the waveguide for further processes.

Figure 10:
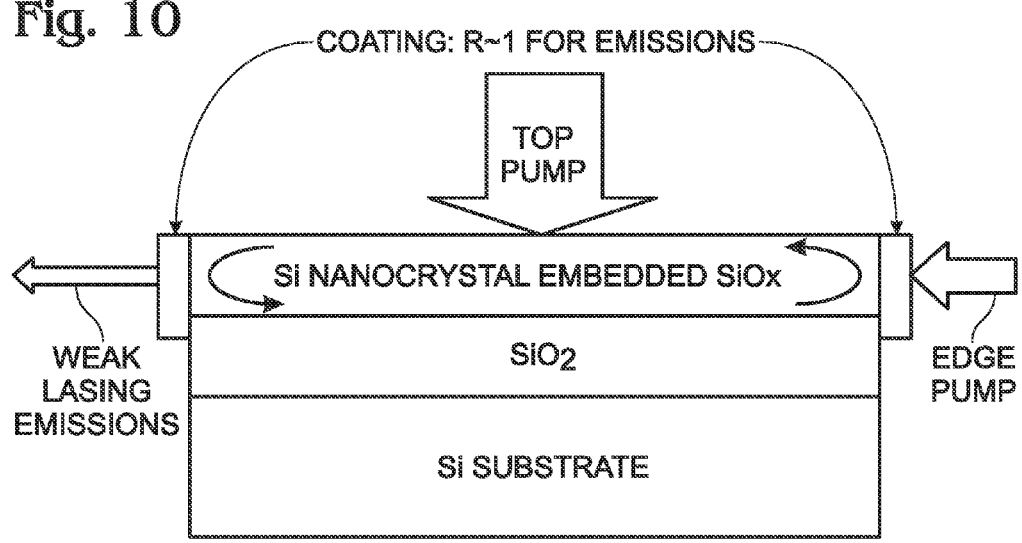
FIG. 10 depicts a SI nanocrystal embedded SiOx waveguide with high reflection ridge edge mirrors.

FIG. 10 depicts a Si nanocrystal embedded SiOx waveguide with high reflection ridge edge mirrors. Two possible pump schemes are shown, one with, a top pump, and the other with edge coupling lens. The mirrors can be made from gold coating or other multiple layer dielectric coatings.

FIG. 11 is a flowchart illustrating a method, for optical amplification using a Si nanocrystal embedded SiOx waveguide. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1100.

Step 1102 provides a Si nanocrystal embedded. SiOx waveguide, where x is less than 2. Step 1104 supplies an optical input signal to the Si nanocrystal embedded SiOx waveguide, having a first power at a first wavelength in a range of 700 to 950 nm. Step 1106 pumps the Si nanocrystal embedded SiOx waveguide with an optical source having a second power at a second wavelength in a range of 250 to 550 nm. Step 1108 generates an optical output signal having a third power, greater than the first power, at the first wavelength. The output signal has a quantum efficiency of greater than 10%

In one aspect. Step 1102 provides a Si nanocrystal embedded SiOx waveguide having a thickness in the range between about 400 microns to about 1000 nm, and an optical index in the range of about 1.58 to 1.75. In another aspect, providing the Si nanocrystal embedded SiOx waveguide in Step 1102 includes providing a Si nanocrystal embedded SiOx waveguide having a strip length, and Step 1106 exposes the SiOx strip length to the optical (pump) source. Then, generating the optical output signal in Step 1108 includes generating an optical output signal having an increased third power in response to increasing the length of the SiOx strip. Likewise, the third power is increased in response to increasing optical source second power at the second wavelength.

In a different, aspect, supplying the optical input signal to the Si nanocrystal embedded SiOx waveguide in Step 1104 includes supplying an optical input signal having a first full width at half magnitude (FWHM). Then, generating the optical output signal in Step 1108 includes generating an optical output signal having a second FWHM, less than the first FWHM. For example, if Step 1104 supplies a first FWHM of about 100 nm, Step 1108 generates an optical signal having a second FWHM of about 25 nm.

Likewise, the Si nanocrystal embedded SiOx waveguide provided in Step 1102 has a width, and Step 1108 generates an optical output signal having a third power responsive to the strip length and strip width. In one aspect, Step 1108 generates an optical output, signal having a linear power gain responsive to changes in strip length at a constant strip width. For example. Step 1108 generates optical power having the linear power gain, of about 137/cm (per centimeter) for a strip width of about 50 microns and a strip length in the range of about 1 to 400 microns. As another example. Step 1108 generates optical power having a gain of about 13.5/cm for a strip with a width of about 500 microns and a strip length in the range of about 0 to 3000 microns.

In a different aspect, providing the Si nanocrystal embedded SiOx waveguide in Step 1102 includes depositing a Si nanocrystal embedded SiOx strip using a high density plasma-enhanced chemical vapor deposition (HDPECVD) process. The HDPECVD process uses a plasma concentration of greater than $1 \times 10^{11}$ cm$^{-3}$, with an electron temperature of less than 10 eV. The HDPECVD process is used to deposit a SiOx strip. Then, in response to annealing, Si nanocrystals are embedded in the SiOx strip. That is, the Si nanocrystal size is enhanced as a result of annealing.

More explicitly, depositing the Si nanocrystal embedded SiOx strip using the HDPECVD process includes:

introducing silane (SiH$_4$) in the range of about 20 to 40 standard cubic centimeters (SCCM);

introducing N$_2$O in the range of about, 15 to 35 SCCM;

supplying power to a top electrode (see FIG. 2) at a frequency in the range of 13.56 to 300 megahertz (MHz), and a power density in the range of about 1 to 20 watts per square centimeter (W/cm$^2$); and, supplying power to a bottom electrode at a frequency in the range of 50 kilohertz to 13.56 MHz, and a power density in the range of about 1 to 5 W/cm$^2$.

In one aspect, annealing the SiOx strip includes annealing for a duration in the range of about 10 to 120 minutes, at a temperature in the range of about 500 to 1100° C. For example, annealing forms Si nanocrystals having a diameter in the range of about 2 to 10 nm.

A method for the fabrication and operation of a Si nanocrystal embedded SiOx waveguide has been presented. Explicit structures and process details have been given to Illustrate the invention. However, the invention is not limited to merely these examples. Other variations and embodiments of the invention will occur to those skilled in the art.

We claim:

1. A method for optical amplification using a silicon (Si) nanocrystal embedded silicon oxide (SiOx) waveguide, the method comprising:
providing a Si nanocrystal embedded SiOx waveguide, where x is less than 2, formed by depositing a Si nanocrystal embedded SiOx strip using a high density plasma-enhanced chemical vapor deposition (HDPECVD) process;
supplying an optical input signal to the Si nanocrystal embedded SiOx waveguide, having a first power at a first wavelength in a range of 700 to 950 nanometers (nm);
pumping the Si nanocrystal embedded SiOx waveguide with an optical source having a second power at a second wavelength in a range of 250 to 550 nm;
generating an optical output signal having a third power, greater than the first power, at the first wavelength, with a quantum efficiency of greater than 10%.

2. The method of claim 1 wherein providing the Si nanocrystal embedded SiOx waveguide includes providing a Si nanocrystal embedded SiOx waveguide having a thickness in a range between about 400 microns to about 1000 nm.

3. The method of claim 1 wherein providing the Si nanocrystal embedded SiOx waveguide includes providing a Si nanocrystal embedded SiOx waveguide having a strip length;
wherein pumping the Si nanocrystal embedded SiOx waveguide includes exposing the SiOx strip length to the optical source; and,
wherein generating the optical output signal includes generating an optical output signal having an increased third power in response to increasing the length of the SiOx strip.

4. The method of claim 1 wherein generating the optical output signal includes generating an optical output signal having an increased third power in response to increasing the optical source second power at the second wavelength.

5. The method of claim 1 wherein supplying the optical input signal to the Si nanocrystal embedded SiOx waveguide includes supplying an optical input signal having an intensity with a first full width at half magnitude (FWHM); and,
wherein generating the optical output signal having the first optical power includes generating the optical output signal having an intensity with a second FWHM, less than the first FWHM in response to supplying the optical input signal to the Si nanocrystal embedded SiOx waveguide and pumping the Si nanocrystal embedded SiOx waveguide with the optical source.

6. The method of claim 5 wherein supplying the optical input signal having the first FWHM includes supplying a first FWHM of about 100 nm; and,
wherein generating the optical output signal having the second FWHM includes generating an optical signal having a second FWHM of about 25 nm.

7. The method of claim 1 wherein providing the Si nanocrystal embedded SiOx waveguide includes providing a waveguide with a strip length and a width; and,
wherein generating the optical output signal having the third power includes generating an optical output signal having a third power responsive to the strip length and strip width.

8. The method of claim 7 wherein generating the optical output signal having the third power responsive to the strip length and strip width includes generating an optical output signal having a linear power gain responsive to changes in strip length at a constant strip width.

9. The method of claim 8 wherein generating the optical power having the linear power gain includes generating a linear power gain selected from a group of about 137/cm (per centimeter) for a strip width of about 50 microns and a strip length in a range of about 1 to 400 microns, and 13.5/cm for a strip with a width of about 500 microns and a strip length in a range of about 0 to 3000 microns.

10. The method of claim 1 wherein providing the Si nanocrystal embedded SiOx waveguide includes providing a Si nanocrystal embedded SiOx waveguide having an optical index in is range of about 1.58 to 1.75.

11. The method of claim 1 wherein forming the Si nanocrystal embedded SiOx strip using the HDPECVD process includes:
subsequent to depositing a SiOx strip, annealing; and,
in response, embedding Si nanocrystals in the SiOx strip.

12. The method of claim 11 wherein depositing the Si nanocrystal embedded SiOx strip includes:
introducing silane ($SiH_4$) in a range of about 20 to 40 standard cubic centimeters (SCCM);
introducing $N_2O$ in a range of about 15 to 35 SCCM;
supplying power to a top electrode at a frequency in a range of 13.56 to 300 megahertz (MHz), and a power density in a range of about 1 to 20 watts per square centimeter ($W/cm^2$); and,
supplying power to a bottom electrode at a frequency in a range of 50 kilohertz to 13.56 MHz, and a power density in a range of about 1 to 5 $W/cm^2$.

13. The method of claim 12 wherein annealing the SiOx strip includes annealing:
for a duration in a range of about 10 to 120 minutes; and,
at a temperature in a range of about 500 to 1100° C.

14. The method of claim 1 wherein depositing the Si nanocrystal embedded SiOx strip using the HDPECVD process includes using a plasma concentration of greater than $1\times10^{11}$ $cm^{-3}$, with an electron temperature of less than 10 eV.

15. The method of claim 11 wherein embedded Si nanocrystals into the SiOx strip in response to annealing includes forming Si nanocrystals having a diameter in a range of about 2 to 10 nm.

16. A silicon (Si) nanocrystal embedded silicon oxide (SiOx) waveguide, the waveguide comprising:
a bottom substrate having an optical index;
a Si nanocrystal embedded SiOx strip, where x is less than 2, formed by depositing a Si nanocrystal embedded SiOx strip using a high density plasma-enhanced chemical vapor deposition (HDPECVD) process, overlying the bottom substrate, having an optical index greater than the top and bottom substrate, a first interface to accept an optical input signal with a first power at a first wavelength in a range of 700 to 950 nanometers (nm), a second interface to accept an optical source pump signal having a second power at a second wavelength in a range of 250 to 550 nm, and a third interface to supply an optical output signal having a third power, greater than the first power, at the first wavelength, with a quantum efficiency of greater than 10%; and,
wherein the Si nanocrystal embedded SiOx strip has a thickness in a range of about 400 microns to about 1000 nm.

17. A silicon (Si) nanocrystal embedded silicon oxide (SiOx) waveguide, the waveguide comprising:
a bottom substrate having an optical index:
a Si nanocrystal embedded SiOx strip, where x is less than 2, formed by depositing a Si nanocrystal embedded SiOx strip using a high density plasma-enhanced chemical vapor deposition (HDPECVD) process, overlying the bottom substrate, having an optical index greater than the top and bottom substrate, a first interface to accept an optical input signal with a first power at a first wavelength in a range of 700 to 950 nanometers (nm), a second interface to accept an optical source pump signal having a second rower at a second wavelength in a range of 250 to 550 nm, and a third interface to supply an optical output signal having a third power, greater than the first power, at the first wavelength, with a quantum efficiency of greater than 10%; and, wherein the Si nanocrystal embedded SiOx waveguide has an optical index in a range of about 1.58 to 1.75.

18. The waveguide of claim 16 wherein the Si nanocrystal embedded SiOx strip has a width in a range of about 50 to 500 microns.

* * * * *

UNITED STATES PATENT AND TRADEMARK OFFICE
CERTIFICATE OF CORRECTION

| | | |
|---|---|---|
| PATENT NO. | : 8,054,540 B2 | Page 1 of 1 |
| APPLICATION NO. | : 12/259986 | |
| DATED | : November 8, 2011 | |
| INVENTOR(S) | : Jiandong Huang et al. | |

It is certified that error appears in the above-identified patent and that said Letters Patent is hereby corrected as shown below:

In column 4, line 63, the term "Si" has been incorrectly printed as --SI--. The paragraph should be printed as follows:

Fig. 10 depicts a Si nanocrystal embedded SiOx waveguide with high reflection ridge edge mirrors.

In Claim 17, the word "power" has been incorrectly printed as --rower--. Claim 17 should be printed as follows:

17. A silicon (Si) nanocrystal embedded silicon oxide (SiOx) waveguide, the waveguide comprising:
a bottom substrate having an optical index;
a Si nanocrystal embedded SiOx strip, where x is less than 2, formed by depositing a Si nanocrystal embedded SiOx strip using a high density plasma-enhanced chemical vapor deposition (HDPECVD) process, overlying the bottom substrate, having an optical index greater than the top and bottom substrate, a first interface to accept an optical input signal with a first power at a first wavelength in a range of 700 to 950 nanometers (nm), a second interface to accept an optical source pump signal having a second power at a second wavelength in a range of 250 to 550 nm, and a third interface to supply an optical output signal having a third power, greater than the first power, at the first wavelength, with a quantum efficiency of greater than 10%; and, wherein the Si nanocrystal embedded SiOx waveguide has an optical index in a range of about 1.58 to 1.75.

Signed and Sealed this
Seventh Day of February, 2012

David J. Kappos
*Director of the United States Patent and Trademark Office*

UNITED STATES PATENT AND TRADEMARK OFFICE
CERTIFICATE OF CORRECTION

PATENT NO. : 8,054,540 B2
APPLICATION NO. : 12/259986
DATED : November 8, 2011
INVENTOR(S) : Jiandong Huang et al.

It is certified that error appears in the above-identified patent and that said Letters Patent is hereby corrected as shown below:

In column 4, line 63, the term "Si" has been incorrectly printed as --SI--. The paragraph should be printed as follows:

Fig. 10 depicts a Si nanocrystal embedded SiOx waveguide with high reflection ridge edge mirrors.

Column 11, line 4 (Claim 17, line 13), the word "power" has been incorrectly printed as --rower--.

Column 10, line 59 - Column 12, line 2, Claim 17 should be printed as follows:

17. A silicon (Si) nanocrystal embedded silicon oxide (SiOx) waveguide, the waveguide comprising:
a bottom substrate having an optical index;
a Si nanocrystal embedded SiOx strip, where x is less than 2, formed by depositing a Si nanocrystal embedded SiOx strip using a high density plasma-enhanced chemical vapor deposition (HDPECVD) process, overlying the bottom substrate, having an optical index greater than the top and bottom substrate, a first interface to accept an optical input signal with a first power at a first wavelength in a range of 700 to 950 nanometers (nm), a second interface to accept an optical source pump signal having a second power at a second wavelength in a range of 250 to 550 nm, and a third interface to supply an optical output signal having a third power, greater than the first power, at the first wavelength, with a quantum efficiency of greater than 10%; and, wherein the Si nanocrystal embedded SiOx waveguide has an optical index in a range of about 1.58 to 1.75.

This certificate supersedes the Certificate of Correction issued February 7, 2012.

Signed and Sealed this
Twenty-eighth Day of February, 2012

David J. Kappos
*Director of the United States Patent and Trademark Office*